(12) United States Patent
Morimoto

(10) Patent No.: US 12,062,595 B2
(45) Date of Patent: Aug. 13, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shunsuke Morimoto, Ibo Hyogo (JP)

(73) Assignees: Kabushiki Kaisha Toshiba, Tokyo (JP); Toshiba Electronic Devices & Storage Corporation, Tokyo (JP)

(*) Notice: Subject to any disclaimer, the term of this patent is extended or adjusted under 35 U.S.C. 154(b) by 527 days.

(21) Appl. No.: 17/463,516

(22) Filed: Aug. 31, 2021

(65) Prior Publication Data

US 2022/0301984 A1 Sep. 22, 2022

(30) Foreign Application Priority Data

Mar. 22, 2021 (JP) ................. 2021-047071

(51) Int. Cl.
*H01L 23/495* (2006.01)
*H01L 23/00* (2006.01)

(52) U.S. Cl.
CPC ........ *H01L 23/49503* (2013.01); *H01L 24/48* (2013.01); *H01L 2224/4826* (2013.01)

(58) Field of Classification Search
CPC ............... H01L 23/49503; H01L 24/48; H01L 2224/4826
See application file for complete search history.

(56) References Cited

U.S. PATENT DOCUMENTS

| 8,253,238 B2* | 8/2012 | Satoh | H01L 23/49551 257/676 |
| 8,680,659 B2* | 3/2014 | Koga | H01L 24/49 257/676 |

FOREIGN PATENT DOCUMENTS

| JP | 2007-095788 A | 4/2007 |
| JP | 2008-103550 A | 5/2008 |
| JP | 2011-066327 A | 3/2011 |
| WO | 2010/131706 A1 | 11/2010 |

* cited by examiner

*Primary Examiner* — Marc Anthony Armand
(74) *Attorney, Agent, or Firm* — Kim & Stewart LLP

(57) ABSTRACT

A semiconductor device includes a resin member, a die pad including a first surface on which a semiconductor chip is disposed and covered by the resin member, and a second surface opposite to the first surface and partially covered by the resin member such that a first portion of the second surface is exposed from the resin member, and a plurality of electrodes each separated from the die pad and including a first surface connected to the semiconductor chip and covered by the resin member, and a second surface partially covered by the resin member such that a second portion of the second surface is exposed from the resin member. The first portion of the die pad includes at least four sides, each of which is nonparallel to a side of the second portion of one of the electrodes that faces the side.

20 Claims, 4 Drawing Sheets

SEMICONDUCTOR DEVICE

CROSS-REFERENCE TO RELATED APPLICATION(S)

This application is based upon and claims the benefit of priority from Japanese Patent Application No. 2021-047071, filed Mar. 22, 2021, the entire contents of which are incorporated herein by reference.

FIELD

Embodiments described herein relate generally to a semiconductor device.

BACKGROUND

There is known a semiconductor device having a package structure in which electrodes are exposed on a surface (hereinafter referred to a mounted surface) opposite to a surface on which a semiconductor chip is mounted.

DETAILED DESCRIPTION

Figure 1A:
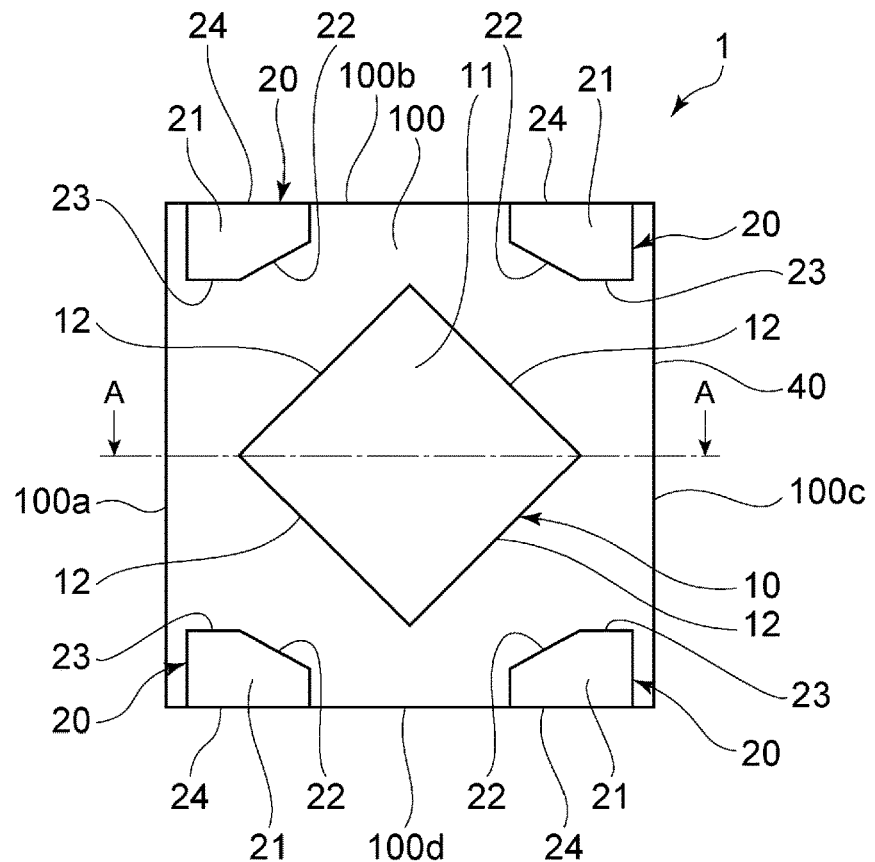
FIG. 1A is a bottom view of a mounted surface of a semiconductor device according to an embodiment.

Embodiments provide a semiconductor device that can be mounted on a large number of substrates having various land pattern sizes.

In general, according to one embodiment, a semiconductor device includes a resin member, a die pad including a first surface on which a semiconductor chip is disposed and covered by the resin member, and a second surface opposite to the first surface and partially covered by the resin member such that a first portion of the second surface is exposed from the resin member, and a plurality of electrodes each separated from the die pad and including a first surface connected to the semiconductor chip and covered by the resin member, and a second surface partially covered by the resin member such that a second portion of the second surface is exposed from the resin member. The first portion of the die pad includes at least four sides, each of which is nonparallel to a side of the second portion of one of the electrodes that faces the side.

Hereinafter, certain example embodiments of the present disclosure will be described with reference to the drawings. Furthermore, in the drawings, the same components are assigned the respective same reference numerals.

Figure 1B:
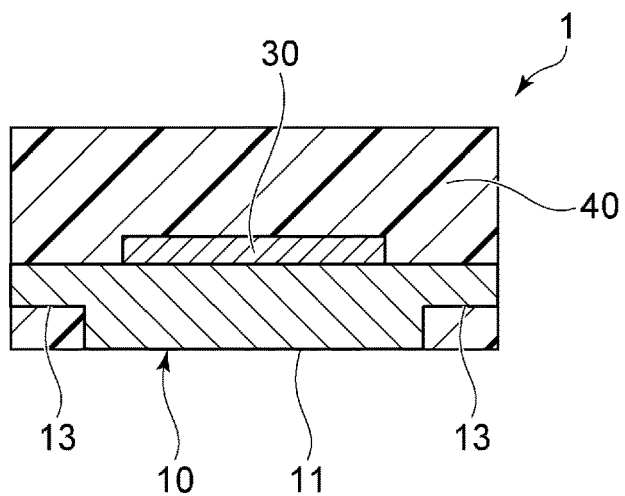
FIG. 1B is a sectional view taken along line A-A illustrated in FIG. 1A.

FIG. 1A is a bottom view of a mounted surface 100 of a semiconductor device 1 according to an embodiment, and FIG. 1B is a sectional view taken along line A-A illustrated in FIG. 1A.

The semiconductor device 1 includes one die pad 10, four electrodes 20, a semiconductor chip 30, and a resin member 40.

As illustrated in FIG. 1A, the semiconductor device 1 includes a quadrangular mounted surface 100. The semiconductor device 1 is mounted on a mounting substrate (i.e., a wiring substrate) such that the mounted surface 100 faces the mounting substrate.

The die pad 10 is arranged at the center of the mounted surface 100. Each of the electrodes 20 is arranged at position away from the die pad 10 at a corresponding one of the four corners of the mounted surface 100. Each of the die pad 10 and the electrodes 20 is made of a metallic material.

As illustrated in FIG. 1B, the semiconductor chip 30 is arranged on the die pad 10. The semiconductor chip 30 is, for example, a power device. The semiconductor chip 30 is covered with the resin member 40.

Figure 2:
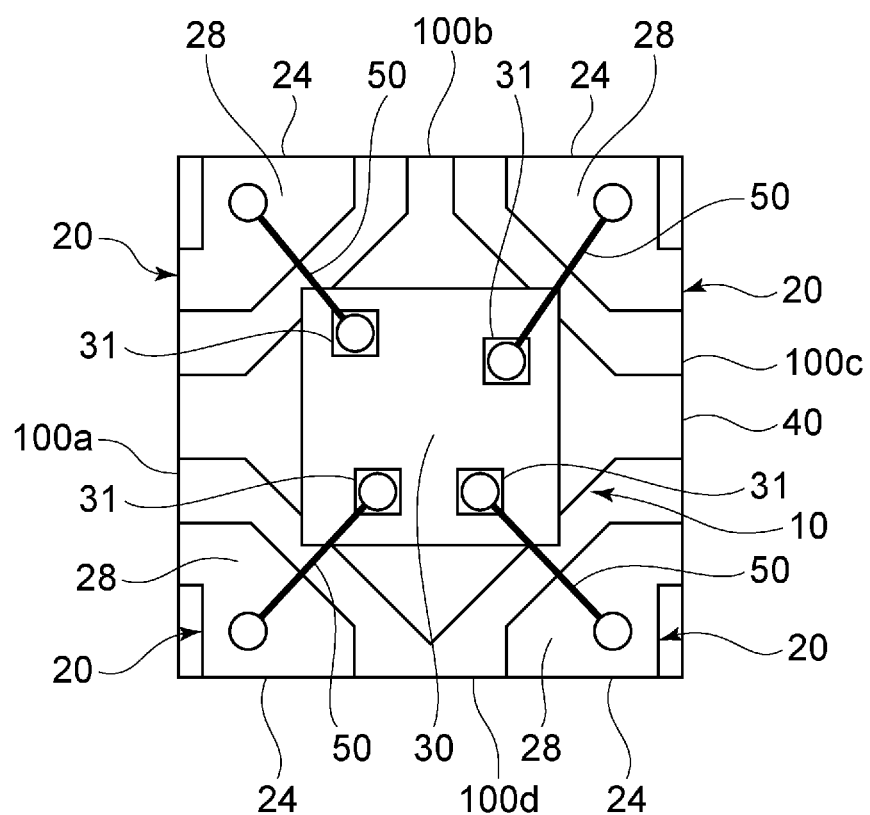
FIG. 2 is a schematic top view of a semiconductor device according to an embodiment.

FIG. 2 is a schematic top view of the semiconductor device 1. In FIG. 2, the resin member 40 is illustrated only with an outline thereof.

Four electrode pads 31 are formed on the upper surface of the semiconductor chip 30, and each of the electrode pads 31 is electrically connected to the obverse surface 28 of a corresponding one of the electrodes 20 by a metal wire 50. The metal wire 50 is covered with the resin member 40. The lower surface of the semiconductor chip 30 is bonded to the upper surface (referred to as a chip mounting surface) of the die pad 10 via a die bonding paste or the like. The semiconductor chip 30 and the die pad 10 are not electrically interconnected to each other via the paste.

As illustrated in FIGS. 1A and 1B, the die pad 10 includes a first lower surface 11, which is exposed from the resin member 40 in the mounted surface 100. As illustrated in FIG. 1B, the first lower surface 11 faces the semiconductor chip 30. The first lower surface 11 is formed in a quadrangular shape having at least four first sides 12, each of which is nonparallel to sides 100a to 100d of the mounted surface 100 (which correspond to the sides or outlines of the resin member 40) lying in a plane identical to the first lower surface 11. Each of the first sides 12 faces a corresponding one of the corners of the mounted surface 100.

Each of the four electrodes 20 includes a second lower surface 21, which is exposed from the resin member 40 in a plane identical to the mounted surface 100, i.e., the first lower surface 11. The second lower surface 21 of the electrode 20 has a second side 22 and a third side 23, which face one of the first sides 12 of the die pad 10. The second side 22 and the third side 23 of the electrode 20 are nonparallel to each first side 12 of the die pad 10. The second side 22 and the third side 23 make, for example, an obtuse angle with each other. The second side 22 is nonparallel to each of the sides 100a to 100d of the mounted surface 100. The third side 23 is parallel to two sides 100b and 100d, which are opposite to each other in the mounted surface 100.

Each of the electrodes 20 includes a side surface 24, which extends along any one of the two opposite sides 100b and 100d of the mounted surface 100, and the side surface is exposed from the resin member 40. The other side surfaces of each of the electrodes 20 are covered with the resin member 40.

Figure 3A:
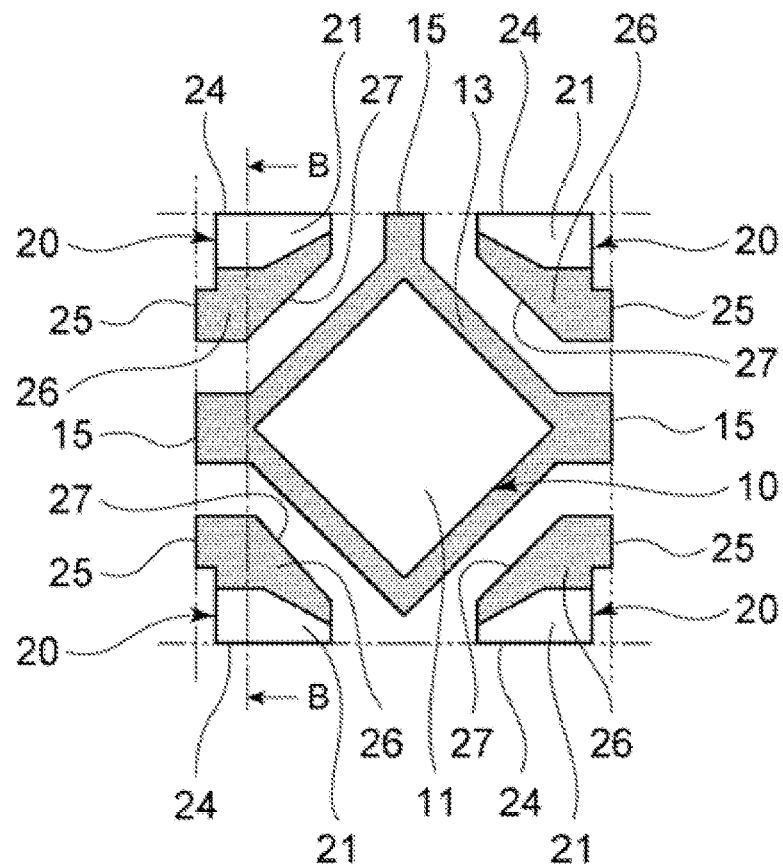
FIG. 3A is a bottom view of a die pad and electrodes in a semiconductor device according to an embodiment.
Figure 3B:
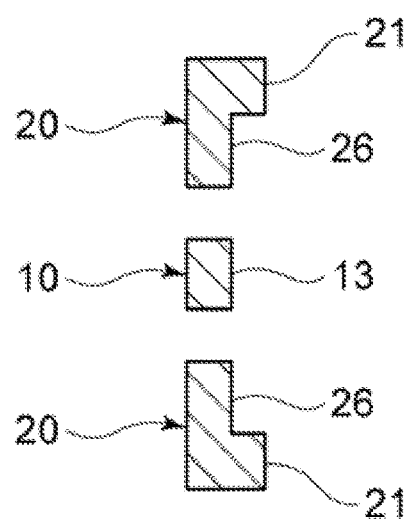
FIG. 3B is a sectional view taken along line B-B illustrated in FIG. 3A.

FIG. 3A is a bottom view of the die pad 10 and the electrodes 20, and FIG. 3B is a sectional view taken along line B-B illustrated in FIG. 3A.

As illustrated in FIG. 1B and FIG. 3A, the die pad 10 includes a third lower surface 13, and a step is formed between the third lower surface 13 and the first lower surface 11. More specifically, with respect to a direction in which the semiconductor chip 30 is mounted, the third lower surface 13 is located closer to the semiconductor chip 30 than the first lower surface 11. Moreover, the third lower surface 13 is located within the resin member 40.

In FIG. 3A, the third lower surface 13 is illustrated in gray. The area of the first lower surface 11 is larger than the area of the third lower surface 13. The third lower surface 13 is covered with the resin member 40, and the first lower surface 11 is exposed from the resin member 40 on the mounted surface 100. Accordingly, the area of the lower surface 11 of the die pad 10 exposed from the resin member 40 is larger than the area of the lower surface 13 of the die pad 10 located within the resin member 40.

Each of the electrodes 20 includes a fourth lower surface 26, and a step is formed between the fourth lower surface 26 and the second lower surface 21. More specifically, with respect to a direction in which the semiconductor chip 30 is mounted, the fourth lower surface 26 is located closer to the semiconductor chip 30 than the second lower surface 21. Moreover, the fourth lower surface 26 is located within the resin member 40. In FIG. 3A, the fourth lower surface 26 is illustrated in gray. The area of the fourth lower surface 26 is larger than the area of the second lower surface 21. The fourth lower surface 26 is covered with the resin member 40, and the second lower surface 21 is exposed from the resin member 40 on the mounted surface 100.

The die pad 10 and the electrodes 20 are cut out from a frame member including die pads and electrodes for a plurality of semiconductor devices. In FIG. 3A, dashed-two dotted lines indicate lines along which the die pad 10 and the electrodes 20 have been cut out. The method of forming the die pad 10 and the electrodes 20 includes mounting the semiconductor chip 30 on the die pad 10, connecting the semiconductor chip 30 to the electrodes 20 with the metal wires 50, sealing these members with the resin member 40, and then cutting out the die pad 10 and the electrodes 20 together with the resin member 40.

The die pad 10 is connected to the frame member by three joining portions 15, and after the above-mentioned cutting-out process, the end surfaces (the cut surfaces) of the three joining portions 15 are exposed from the resin member 40. Portions of the die pad 10 other than the first lower surface 11 and the end surfaces of the joining portions 15 are covered with the resin member 40.

Each of the electrodes 20 is connected to the frame member by the above-mentioned side surface 24 and a joining portion 25, and after the above-mentioned cutting-out process, the side surface 24 and the end surface of the joining portion 25 are exposed from the resin member 40. Portions of each of the electrodes 20 other than the second lower surface 21, the side surface 24, and the end surface of the joining portion 25 are covered with the resin member 40.

The first lower surface 11 of the die pad 10 and the second lower surface 21 of each of the electrodes 20 are connected to a land pattern of the mounting substrate by, for example, soldering. To prevent solder from protruding to an adjacent land pattern or the like, the land pattern of the mounting substrate is required to have a size larger than that of each of the electrodes 20 of the semiconductor device 1, which is a target to be mounted. Thus, the area of the second lower surface 21 of each of the electrodes 20 is required to be smaller than the area of the land pattern of the mounting substrate to which the second lower surface 21 is to be connected.

According to the present embodiment, setting the area of the second lower surface 21, which is a surface used for mounting the electrodes 20, to be smaller than the area of the fourth lower surface 26 located within the resin member enables the semiconductor device 1 to be mounted on substrates having various land pattern sizes. Thus, as the area of the second lower surface 21 is set smaller, the semiconductor device 1 can be mounted on a larger number of substrates having various sizes of land pattern.

On the other hand, the fourth lower surface 26, which is larger in area than the second lower surface 21, is covered with the resin member 40 and this enables increasing the adhesiveness between each of the electrodes 20 and the resin member 40. Moreover, setting the area of the first lower surface 11 (which is used for mounting at the land pattern) of the die pad 10 larger than the area of the third lower surface 13 located within the resin member 40 enables increasing the connection strength of the semiconductor device 1 to the mounting substrate.

As illustrated in FIG. 3A, after the whole portion in the thickness direction of the electrode 20 is formed to have the shape of the fourth lower surface 26, a part of the shaped portion in the thickness direction is removed by etching, so that the second lower surface 21, which is smaller in area than the fourth lower surface 26, is formed. A side 27 of the fourth lower surface 26 facing the first side 12 of the die pad 10 is formed to be in parallel to the first side 12. Then, as illustrated in FIG. 1A, the second lower surface 21 is formed by the above-mentioned etching in such a manner that the second side 22 of the second lower surface 21 facing the first side 12 of the die pad 10 becomes nonparallel to the first side 12. This facilitates efficiently making the area of the second lower surface 21 smaller than the area of the fourth lower surface 26 without changing the length (a length in a direction along the side 100*b* or 100*d* of the mounted surface 100) of the side surface 24 of the electrode 20 over the thickness direction between before and after the etching. If etching is performed in such a manner that the second side 22 of the second lower surface 21 becomes parallel to the first side 12 of the first lower surface 11, the side surface 24 of the electrode 20 is likely to be partially etched.

Not decreasing the length of the side surface 24 of the electrode 20 in the thickness direction enables increasing the strength of the mounting of the electrode 20 to the land pattern. Thus, making the second side 22 of the second lower surface 21, which faces the first side 12 of the die pad 10, nonparallel to the first side 12 while maintaining the length of the side surface 24 of the electrode 20 obtained before etching over the thickness direction, enables efficiently decreasing the area of the second lower surface 21 while securing the mounting strength, and the semiconductor device 1 can be mounted on a larger number of substrates having various sizes of the land pattern.

Moreover, since high adhesiveness is secured between the electrode 20 and the resin member 40 at the fourth lower surface 26, which is larger in area than the second lower surface 21, the electrode 20 can be prevented or reduced from fracturing or dropping off due to stress occurring at the time of cutting out from the frame member.

Figure 4:
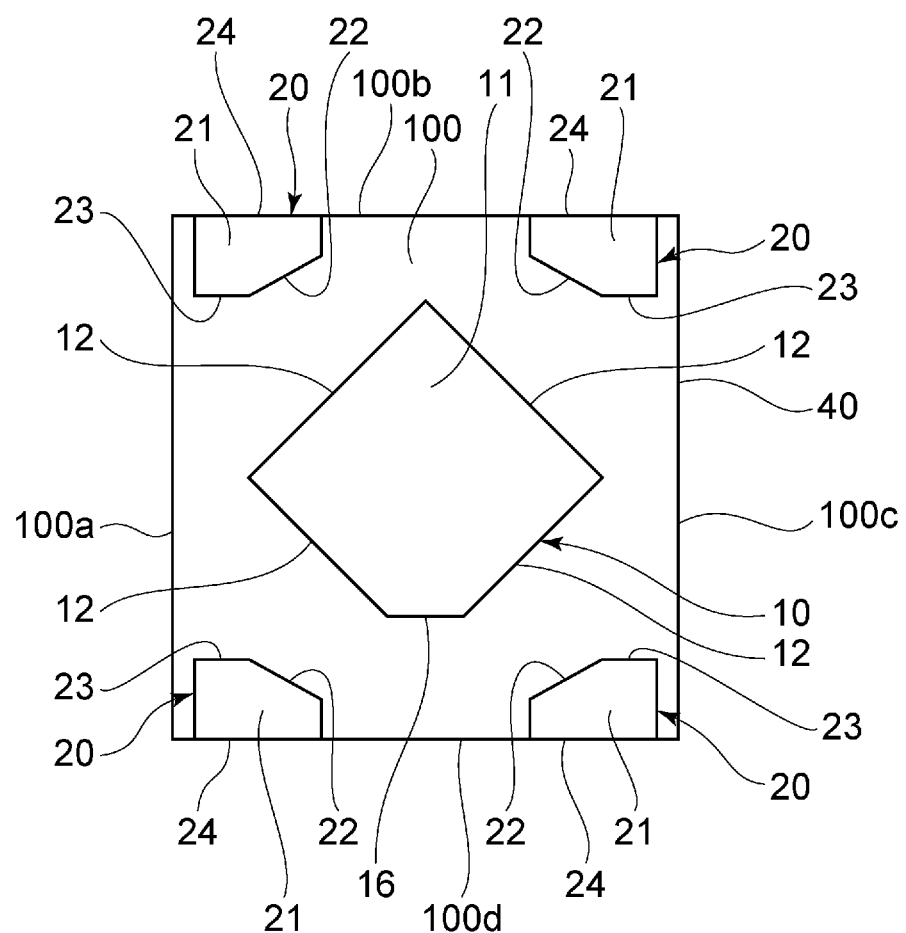
FIG. 4 is a bottom view of another example of a mounted surface of a semiconductor device according to an embodiment.

FIG. 4 is a bottom view of another example of the mounted surface 100 of a semiconductor device according to an embodiment.

In the example illustrated in FIG. 4, the first lower surface 11 of the die pad 10 is formed to have a side 16 parallel to one side (for example, the side 100*d*) of the mounted surface 100. The arrangement relationships of the four electrodes 20 to the side 16 enable identifications of each of the electrodes 20 (for example, a drain electrode, a source electrode, a gate electrode, and a ground).

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a resin member;
a die pad including:
a first surface on which a semiconductor chip is disposed and covered by the resin member, and
a second surface opposite to the first surface and partially covered by the resin member such that a first portion of the second surface is exposed from the resin member; and
a plurality of electrodes each separated from the die pad and including:
a first surface connected to the semiconductor chip and covered by the resin member, and
a second surface partially covered by the resin member such that a second portion of the second surface is exposed from the resin member, wherein
the first portion of the die pad includes at least four sides, each of which is nonparallel to a side of the second portion of one of the electrodes that faces the side.

2. The semiconductor device according to claim 1, wherein any side of the first portion of the die pad is nonparallel to a side of the semiconductor chip.

3. The semiconductor device according to claim 1, wherein each of the electrodes includes a side surface exposed from the resin member towards one of directions parallel to the first surface of the die pad.

4. The semiconductor device according to claim 1, wherein an area of the second portion of the second surface of each electrode is smaller than an area of the other portion of the second surface that is covered by the resin member.

5. The semiconductor device according to claim 1, wherein each of the electrodes includes a recess in one of two side surfaces that are adjacent and perpendicular to each other.

6. The semiconductor device according to claim 5, wherein the resin member is filled in the recess.

7. The semiconductor device according to claim 1, wherein the first portion of the die pad has a square shape.

8. The semiconductor device according to claim 1, wherein the first portion of the die pad has five first sides, one of which is parallel to a side of the semiconductor chip.

9. The semiconductor device according to claim 1, wherein the first portion of the die pad and the second portion of each electrode are on a same plane.

10. The semiconductor device according to claim 1, wherein the resin member is between the die pad and each of the electrodes.

11. A semiconductor device, comprising:
a semiconductor chip;
a die pad including:
a first surface on which the semiconductor chip is disposed and covered by a resin member,
a second surface below the first surface in a first direction and covered by the resin member, and
a third surface below the second surface in the first direction and exposed from the resin member; and
a plurality of electrodes each including:
a first surface connected to the semiconductor chip,
a second surface below the first surface in the first direction and covered by the resin member, and
a third surface below the second surface in the first direction and exposed from the resin member.

12. The semiconductor device according to claim 11, wherein the third surface of the die pad has at least four first sides, each of which is nonparallel to a side of the third surface of one of the electrodes that faces thereto.

13. The semiconductor device according to claim 11, wherein any side of the third surface of the die pad is nonparallel to a side of the semiconductor chip.

14. The semiconductor device according to claim 11, wherein each of the electrodes includes a side surface exposed from the resin member towards one of directions perpendicular to the first direction.

15. The semiconductor device according to claim 11, wherein an area of the third surface of each of the electrodes is smaller than an area of the second surface thereof.

16. The semiconductor device according to claim 11, wherein each of the electrodes includes a recess in one of two side surfaces that are adjacent and perpendicular to each other.

17. The semiconductor device according to claim 16, wherein the resin member is filled in the recess.

18. The semiconductor device according to claim 11, wherein the third surface of the die pad has a square shape.

19. The semiconductor device according to claim 11, wherein the third surface of the die pad has five sides, one of which is parallel to a side of the semiconductor chip.

20. The semiconductor device according to claim 11, wherein the third surface of the die pad and the third surface of each of the electrodes are on a same plane.

* * * * *